United States Patent
Wang et al.

(10) Patent No.: US 12,433,111 B2
(45) Date of Patent: Sep. 30, 2025

(54) DISPLAY SUBSTRATE HAVING SPACING GROOVE AND MANUFACTURING METHOD THEREFOR, AND DISPLAY DEVICE HAVING SPACING GROOVE

(71) Applicant: BOE Technology Group Co., Ltd., Beijing (CN)

(72) Inventors: Qing Wang, Beijing (CN); Kuanta Huang, Beijing (CN); Xiaochuan Chen, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 585 days.

(21) Appl. No.: 17/763,212

(22) PCT Filed: May 14, 2021

(86) PCT No.: PCT/CN2021/093931
§ 371 (c)(1),
(2) Date: Mar. 24, 2022

(87) PCT Pub. No.: WO2021/254058
PCT Pub. Date: Dec. 23, 2021

(65) Prior Publication Data
US 2022/0336556 A1    Oct. 20, 2022

(30) Foreign Application Priority Data

Jun. 19, 2020 (CN) .......................... 202010565660.X

(51) Int. Cl.
*H10K 59/124* (2023.01)
*H10K 59/12* (2023.01)
(Continued)

(52) U.S. Cl.
CPC ............ *H10K 59/124* (2023.02); *H10K 71/00* (2023.02); *H10K 59/1201* (2023.02); *H10K 59/122* (2023.02); *H10K 59/35* (2023.02)

(58) Field of Classification Search
CPC ............. H10K 59/124; H10K 59/1201; H10K 59/122; H10K 59/35; H10K 71/00
(Continued)

(56) References Cited

U.S. PATENT DOCUMENTS

2007/0063645 A1* 3/2007 Yokoyama ............. H10K 71/00
 313/506
2008/0036366 A1* 2/2008 Yaegashi ............... H10K 50/856
 445/35

(Continued)

FOREIGN PATENT DOCUMENTS

| CN | 107369778 A | 11/2017 |
|---|---|---|
| CN | 208797004 U | 4/2019 |

(Continued)

OTHER PUBLICATIONS

International Search Report for PCT/CN2021/093931 Mailed Aug. 17, 2021.

(Continued)

*Primary Examiner* — Eric W Jones
(74) *Attorney, Agent, or Firm* — Ling Wu; Stephen Yang; Ling and Yang Intellectual Property

(57) ABSTRACT

A display substrate, comprising: a plurality of first electrodes having a planar middle part which are located on a planarization layer of a driving backplane, a spacing groove exposing a planar surface of the planarization layer being provided between two adjacent first electrodes; an electric leakage blocking layer located on a first electrode layer and located between two adjacent first electrodes, the electric leakage blocking layer being provided with a blocking (Continued)

groove corresponding to the spacing groove and exposing the planar surface of the planarization layer, and the electric leakage blocking layer being overlapped on the surface of the middle part on at least one side; and a light-emitting functional layer located at the side of the electric leakage blocking layer and the first electrode layer away from the driving backplane.

18 Claims, 4 Drawing Sheets

(51) Int. Cl.
  *H10K 59/122* (2023.01)
  *H10K 59/35* (2023.01)
  *H10K 71/00* (2023.01)

(58) Field of Classification Search
  USPC .............................................. 257/40, 59, 89
  See application file for complete search history.

(56) References Cited

U.S. PATENT DOCUMENTS

| | | | |
|---|---|---|---|
| 2011/0215329 A1* | 9/2011 | Chung | H10K 59/87 257/59 |
| 2015/0008398 A1* | 1/2015 | Lee | H10K 71/00 438/35 |
| 2015/0034923 A1* | 2/2015 | Kim | H10K 50/131 257/40 |
| 2015/0048328 A1* | 2/2015 | Kato | H10K 59/80515 438/34 |
| 2016/0254340 A1 | 9/2016 | Kwon et al. | |
| 2017/0098687 A1 | 4/2017 | Kim et al. | |
| 2017/0110683 A1* | 4/2017 | Koresawa | H10K 50/8426 |
| 2017/0221975 A1 | 8/2017 | Lee et al. | |
| 2017/0309852 A1* | 10/2017 | Seo | H10K 50/818 |
| 2019/0305051 A1* | 10/2019 | Takahashi | H10K 59/12 |
| 2020/0243791 A1* | 7/2020 | Campbell | H10K 71/00 |
| 2022/0006040 A1* | 1/2022 | Arakawa | H10K 50/828 |

FOREIGN PATENT DOCUMENTS

| | | |
|---|---|---|
| CN | 110752244 A | 2/2020 |
| CN | 110993806 A | 4/2020 |
| CN | 111668381 A | 9/2020 |
| KR | 10-2016-0105956 A | 9/2016 |

OTHER PUBLICATIONS

The First Office Action dated Sep. 15, 2021 for Chinese Patent Application No. 202010565660.X and English Translation.
The Second Office Action dated May 7, 2022 for Chinese Patent Application No. 202010565660.X and English Translation.

* cited by examiner

| Provide a driving backplane including a driving structure layer and a planarization layer overlying the driving structure layer, wherein the planarization layer is an inorganic layer, a via hole is provided in the planarization layer, the via hole is filled with a conductive metal, and the planarization layer has a flat surface in a position outside the via hole |
|---|

| Form a first electrode layer on a surface of one side of the planarization layer away from the driving structure layer, wherein the first electrode layer includes a plurality of first electrodes distributed in an array, there is a spacing groove, which exposes the flat surface of the planarization layer, between two adjacent first electrodes, the first electrode includes a flat middle portion, and the first electrode is electrically connected to the driving structure layer through the conductive metal in the via hole |
|---|

| Form an electric leakage cutoff layer on the surface of the planarization layer, on which the first electrode layer is formed, wherein the electric leakage cutoff layer is located between two adjacent first electrodes, a cutoff groove corresponding to the spacing groove and exposing the flat surface of the planarization layer is provided in the electric leakage cutoff layer, the depth of the cutoff groove is greater than or equal to the thickness of the middle portion, and the electric leakage cutoff layer laps over a surface of one side of the middle portion on at least one side away from the driving backplane |
|---|

| Form a light-emitting functional layer at one side of the electric leakage cutoff layer and the first electrode layer away from the driving backplane |
|---|

| Form a second electrode layer at one side of the light-emitting functional layer away from the driving backplane |
|---|

FIG. 7

DISPLAY SUBSTRATE HAVING SPACING GROOVE AND MANUFACTURING METHOD THEREFOR, AND DISPLAY DEVICE HAVING SPACING GROOVE

CROSS-REFERENCE TO RELATED APPLICATION

This application is a national stage application of PCT Application No. PCT/CN2021/093931, which is filed on May 14, 2021 and claims priority to Chinese Patent Application No. 202010565660.X, entitled "Display Substrate and Manufacturing Method Therefor, and Display Apparatus" and filed on Jun. 19, 2020, the content of which is incorporated herein by reference in its entirety.

TECHNICAL FIELD

The present disclosure relates to, but is not limited to, the field of display technology, and particularly, to a display substrate and a manufacturing method therefor, and a display apparatus.

BACKGROUND

In recent years, as near-eye displays, silicon-based Organic Light-Emitting Diode (OLED) micro displays are often used in the field of Virtual Reality (VR)/Augmented Reality (AR). The silicon-based semiconductor process is mature and has high integration, enabling ultra-high Pixels Per Inch (PPI) display.

It is found in use that there is cross color or crosstalk in silicon-based OLED micro displays, which affects the color gamut of the displays and decreases the quality and color purity of the displays.

SUMMARY

The following is a summary about the subject matter described herein in detail. The summary is not intended to limit the protection scope of the claims.

In one aspect, an embodiment of the present disclosure provides a display substrate, including:

a driving backplane including a driving structure layer and a planarization layer overlying the driving structure layer, wherein the planarization layer is an inorganic layer, a via hole is provided in the planarization layer, the via hole is filled with a conductive metal, and the planarization layer has a flat surface in a position outside the via hole;

a first electrode layer located at one side of the planarization layer away from the driving structure layer, wherein the first electrode layer includes a plurality of first electrodes distributed in an array, there is a spacing groove, which exposes a flat surface of the planarization layer, between two adjacent first electrodes, the first electrode includes a flat middle portion, and the first electrode is electrically connected to the driving structure layer through the conductive metal in the via hole;

an electric leakage cutoff layer located at one side of the first electrode layer away from the driving backplane, wherein the electric leakage cutoff layer is located between two adjacent first electrodes, a cutoff groove corresponding to the spacing groove and exposing the flat surface of the planarization layer is provided in the electric leakage cutoff layer, the depth of the cutoff groove is greater than or equal to the thickness of the middle portion, and the electric leakage cutoff layer laps over a surface of at least one side of the middle portion away from the driving backplane;

a light-emitting functional layer located at one side of the electric leakage cutoff layer and the first electrode layer away from the driving backplane; and a second electrode layer located at one side of the light-emitting functional layer away from the driving backplane.

In some possible implementations, the electric leakage cutoff layer located at both sides of the cutoff groove laps over the surface of one side of the corresponding middle portion away from the driving backplane, and the electric leakage cutoff layer overlies a side surface of the first electrode facing the spacing groove.

In some possible implementations, the first electrode further includes a climbing portion surrounding the middle portion, the second electrode layer includes a plurality of gentle portions corresponding to the middle portions and connecting portions located between two adjacent gentle portions, the thickness of the light-emitting functional layer located between the gentle portion and the middle portion is d0 in a direction perpendicular to the driving backplane, the minimum value of the sum of the thickness of the electric leakage cutoff layer lapping over the middle portion and the thickness of the middle portion is d1, and a ratio of d1 to d0 is 0.3 to 1.

In some possible implementations, a ratio of the thickness of the middle portion to the thickness of the electric leakage cutoff layer lapping over the middle portion is 2 to 4 in the direction perpendicular to the driving backplane.

In some possible implementations, the thickness of the middle portion is 1000 angstroms to 1800 angstroms, and the thickness of the electric leakage cutoff layer lapping over the surface of the middle portion is 300 angstroms to 800 angstroms.

In some possible implementations, a ratio of the thickness of the middle portion to the thickness of the gentle portion of the second electrode layer is 7 to 13 in the direction perpendicular to the driving backplane.

In some possible implementations, the first electrode includes a composite conductive layer located on a surface of the driving backplane and a protective conductive layer located at one side of the composite conductive layer away from the driving backplane, a periphery of the protective conductive layer is in contact with the surface of the driving backplane, and a material of the protective conductive layer includes at least one of indium tin oxide and indium zinc oxide, and the composite conductive layer includes a first conductive layer and a second conductive layer which are sequentially stacked from the driving backplane towards the light-emitting functional layer, a material of the first conductive layer includes titanium, and a material of the second conductive layer includes at least one of silver and aluminum.

In some possible implementations, the first electrode includes a composite conductive layer located on the surface of the driving backplane and a protective conductive layer located at one side of the composite conductive layer away from the driving backplane, a periphery of the protective conductive layer is in contact with the surface of the driving backplane, and a material of the protective conductive layer includes at least one of indium tin oxide and indium zinc oxide, and the composite conductive layer includes a first conductive layer, a second conductive layer and a third conductive layer which are sequentially stacked from the driving backplane towards the light-emitting functional layer, a material of the first conductive layer includes titanium, a material of the second conductive layer includes at least one of silver and aluminum, and a material of the third conductive layer includes titanium.

In some possible implementations, the width of a lap-over area between the electric leakage cutoff layer and the middle portion is 0.05 μm to 0.3 μm in a plane parallel to the driving backplane, the width of a lap-over area being a dimension of the lap-over area in a direction perpendicular to an extension direction of the electric leakage cutoff layer.

In some possible implementations, the width of the cutoff groove is 0.3 μm to 1.5 μm, the width of the cutoff groove being a dimension of the cutoff groove in a direction perpendicular to an extension direction of the cutoff groove.

In some possible implementations, the electric leakage cutoff layer located at both sides of the cutoff groove overlies the surface of one side of the corresponding first electrode facing the cutoff groove.

In some possible implementations, a slope angle of a side wall of the cutoff groove is 60° to 120°, the slope angle of the side wall of the cutoff groove being an angle between the side wall of the cutoff groove and a bottom wall of the cutoff groove.

In some possible implementations, the first electrode further includes a climbing portion surrounding the middle portion, and a slope angle of the climbing portion is 70° to 90°, the slope angle of the climbing portion being an angle between the climbing portion and the bottom wall of the spacing groove.

In some possible implementations, the light-emitting functional layer includes a hole injection layer, a hole transport layer, a first light-emitting layer, a second light-emitting layer, an intermediate layer, a third light-emitting layer, a hole blocking layer, an electron transport layer and an electron injection layer stacked from the first electrode towards one side of the second electrode layer, and the thickness of the hole injection layer is 70 angstroms to 130 angstroms.

In some possible implementations, the first light-emitting layer is a red light emitting layer, the second light-emitting layer is a green light emitting layer and the third light-emitting layer is a blue light emitting layer.

In another aspect, an embodiment of the present disclosure further provides a method for manufacturing a display substrate, including:

providing a driving backplane including a driving structure layer and a planarization layer overlying the driving structure layer, wherein the planarization layer is an inorganic layer, a via hole is provided in the planarization layer, the via hole is filled with a conductive metal, and the planarization layer has a flat surface in a position outside the via hole;

forming a first electrode layer on a surface of one side of the planarization layer away from the driving structure layer, wherein the first electrode layer includes a plurality of first electrodes distributed in an array, there is a spacing groove, which exposes the flat surface of the planarization layer, between two adjacent first electrodes, the first electrode includes a flat middle portion, and the first electrode is electrically connected to the driving structure layer through the conductive metal in the via hole;

forming an electric leakage cutoff layer on the surface of the planarization layer, on which the first electrode layer is formed, wherein the electric leakage cutoff layer is located between two adjacent first electrodes, a cutoff groove corresponding to the spacing groove and exposing the flat surface of the planarization layer is provided in the electric leakage cutoff layer, the depth of the cutoff groove is greater than or equal to the thickness of the middle portion, and the electric leakage cutoff layer laps over a surface of at least one side of the middle portion away from the driving backplane;

forming a light-emitting functional layer at one side of the electric leakage cutoff layer and the first electrode layer away from the driving backplane; and forming a second electrode layer at one side of the light-emitting functional layer away from the driving backplane.

In some possible implementations, the forming a first electrode layer on a surface of one side of the planarization layer away from the driving structure layer includes:

coating an adhesive layer on the surface of one side of the planarization layer away from the driving structure layer, mask-exposing and developing the adhesive layer, forming a fully exposed area in the position of the first electrode to remove the adhesive layer to expose the surface of the planarization layer, and forming an unexposed area in the other position to retain the adhesive layer;

depositing a composite conductive thin film on the driving backplane, on which an adhesive layer pattern is formed, wherein in the fully exposed area, the composite conductive thin film is deposited on the surface of the planarization layer, and in the unexposed area, the composite conductive thin film is deposited on a surface of the adhesive layer;

removing the adhesive layer from the unexposed area to remove the composite conductive thin film on the surface of the adhesive layer, the composite conductive thin film located in the fully exposed area forming a composite conductive layer; and depositing a protective conductive thin film on the surface of the planarization layer, on which the composite conductive layer is formed, and patterning the protective conductive thin film using a patterning process including dry etching to form a protective conductive layer overlying the composite conductive layer, a periphery of the protective conductive layer being in contact with the surface of the planarization layer.

In some possible implementations, a material of the protective conductive layer includes at least one of indium tin oxide and indium zinc oxide, the composite conductive layer includes a first conductive layer and a second conductive layer which are sequentially stacked from the driving backplane towards the light-emitting functional layer, a material of the first conductive layer includes titanium, and a material of the second conductive layer includes at least one of silver and aluminum.

In some possible implementations, a material of the protective conductive layer includes at least one of indium tin oxide and indium zinc oxide, the composite conductive layer includes a first conductive layer, a second conductive layer and a third conductive layer which are sequentially stacked from the driving backplane towards the light-emitting functional layer, a material of the first conductive layer includes titanium, a material of the second conductive layer includes at least one of silver and aluminum, and a material of the third conductive layer includes titanium.

In still another aspect, an embodiment of the present disclosure further provides a display apparatus, including the display substrate described above.

Other features and advantages of technical schemes of the present disclosure will be elaborated in the following specification and become apparent partially from the specification or are understood by implementing the technical schemes of the present disclosure. The objects and advantages of the technical schemes of the present disclosure may be implemented and obtained through structures particularly pointed out in the specification and the drawings.

BRIEF DESCRIPTION OF DRAWINGS

The drawings are intended to provide an understanding of the technical schemes of the present disclosure and form a part of the specification. They are used to explain the technical schemes of the present disclosure together with the embodiments of the present disclosure, and do not form limitations to the technical schemes of the present disclosure.

FIG. 7 is a schematic diagram of a method for manufacturing a display substrate.

DETAILED DESCRIPTION

Figure 1:
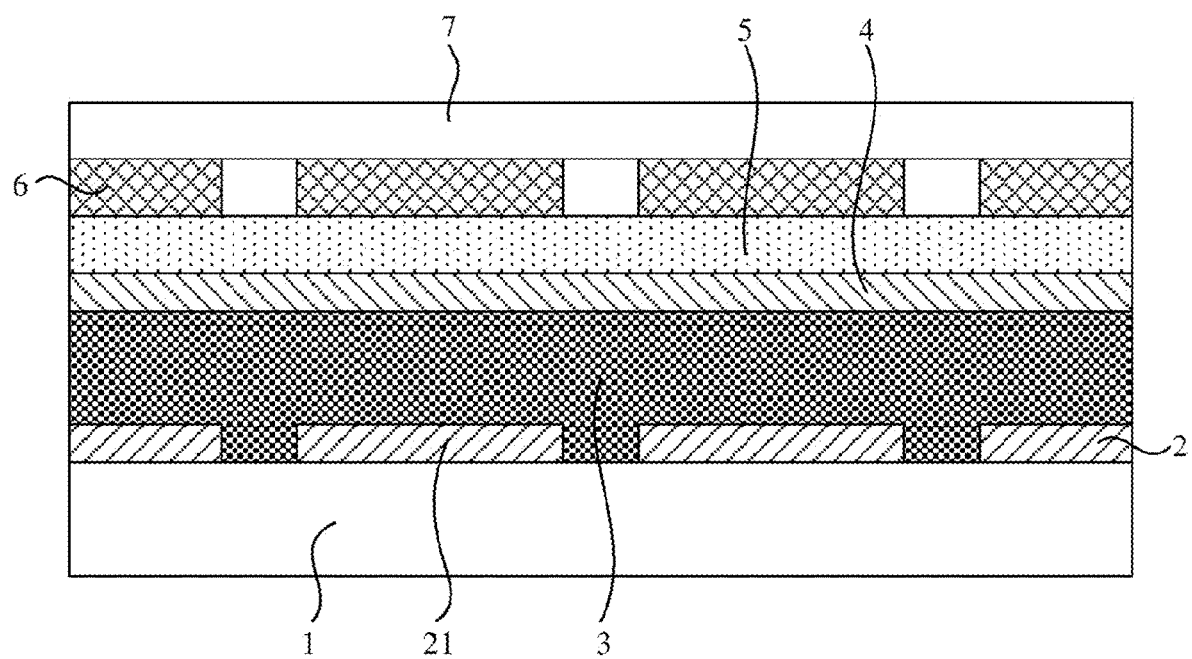
FIG. 1 is a schematic diagram of a structure of a silicon-based OLED display panel.

Embodiments of the present disclosure will be described in detail below in combination with the drawings. Their implementations may be carried out in many different forms. Those of ordinary skill in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other without conflicts.

Sometimes for clarity, sizes of various constituent elements, thicknesses of layers or areas in the drawings may be exaggerated. Therefore, the implementation of the present disclosure is not necessarily limited to the sizes, and the shapes and sizes of various components in the drawings do not reflect the true proportion. In addition, the drawings schematically illustrate ideal examples, and the implementation of the present disclosure is not limited to the shapes or numerical values shown in the drawings.

Ordinal numerals such as "first", "second", "third" and the like in the present disclosure are set to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the present disclosure to illustrate position relationships between the constituent elements with reference to the drawings, which are intended to facilitate description of the present disclosure and simplification of the description, but not to indicate or imply that the mentioned apparatus or element must have a specific orientation or be constructed and operated in a specific orientation. Therefore, they should not be understood as limitations to the present disclosure. The position relationships between the constituent elements are appropriately changed according to the direction in which the various constituent elements are described. Therefore, description is not limited to the words and phrases used in the specification, and appropriate substitutions may be made according to situations.

Unless otherwise specified and defined explicitly, the terms "installed", "coupled" and "connected" should be understood in a broad sense in the present disclosure. For example, the connection may be a fixed connection, a detachable connection or an integrated connection, or may be a mechanical connection or an electrical connection, or may be a direct connection, an indirect connection through intermediate components, or communication inside two components. For those of ordinary skill in the art, the meanings of the above terms in the present disclosure can be understood according to situations.

In the present disclosure, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. In the present disclosure, the channel region refers to a region which the current flows mainly through.

In the present disclosure, it may be the case that the first pole is a drain electrode and the second pole is a source electrode, and it also may be the case that the first pole is a source electrode and the second pole is a drain electrode. In the case that transistors with opposite polarities are used or that a current direction is changed during circuit operation, functions of "the source electrode" and "the drain electrode" may sometimes be exchanged. Therefore, "the source electrode" and "the drain electrode" may be exchanged in the present disclosure.

In the present disclosure, "electrical connection" includes a case in which the constituent elements are connected together through an element with a certain electric action. The "element with a certain electric action" is not particularly limited as long as it allows sending and receiving of electric signals between the connected constituent elements. Examples of the "element with a certain electric action" include not only an electrode and wiring, but also a switching element such as a transistor, a resistor, an inductor, a capacitor, other elements with various functions, etc.

In the present disclosure, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

"Thickness" mentioned herein refers to a dimension of a film layer in a direction perpendicular to the driving backplane.

FIG. 1 is a schematic diagram of a structure of a silicon-based OLED display panel. As shown in FIG. 1, the silicon-based OLED display panel includes a driving backplane 1, a first electrode layer 2, a light-emitting functional layer 3, a second electrode layer 4, an encapsulation layer 5, a color filter layer 6 and a cover plate 7. The driving backplane 1 may be a silicon-based backplane. The first electrode layer 2 is located at one side of the driving backplane 1. The first electrode layer 2 may include a plurality of first electrodes 21 arranged in an array. The light-emitting functional layer 3 is located at one side of the first electrode layer 2 away from the driving backplane 1. The second electrode layer 4 is located at one side of the light-emitting functional layer 3 away from the driving backplane 1. The encapsulation layer 5 is located at one side of the second electrode layer 4 away from the driving backplane 1. The color filter layer 6 is located at one side of the encapsulation layer 5 away from the driving backplane 1, and the cover plate 7 is located at one side of the color filter layer 6 away from the driving backplane 1. The first electrode 21 may form a pixel together with the light-emitting functional layer 3 and the second electrode layer 4 above the first electrode 21.

The silicon-based OLED display panel is small in size and can realize ultra-high PPI display. In the silicon-based OLED display panel, a gap between adjacent first electrodes 21 is only 0.3 μm (micrometer) to 2 μm. The light-emitting functional layer 3 includes a plurality of organic layers, such as a hole injection layer, a hole transport layer, an organic light-emitting layer, an electron transport layer and the like. In the silicon-based OLED display panel, whole-surface evaporation is used for the manufacturing of the light-emitting functional layer 3, that is, the organic layers between adjacent pixels are connected. Since the hole injection layer has relatively good conductivity, in a one pixel working state (that is, one pixel emits light), a current will transmit from the first electrode 21 to other adjacent pixels through the hole injection layer, resulting in lateral leakage. Pixels of the display panel are arranged at intervals, and when a certain pixel emits light, its adjacent pixels will also emit weak light due to lateral leakage, resulting in the phenomenon of concomitant light emitting or crosstalk, thereby affecting the color gamut of a display and decreases the quality and color purity of the display.

Figure 2:
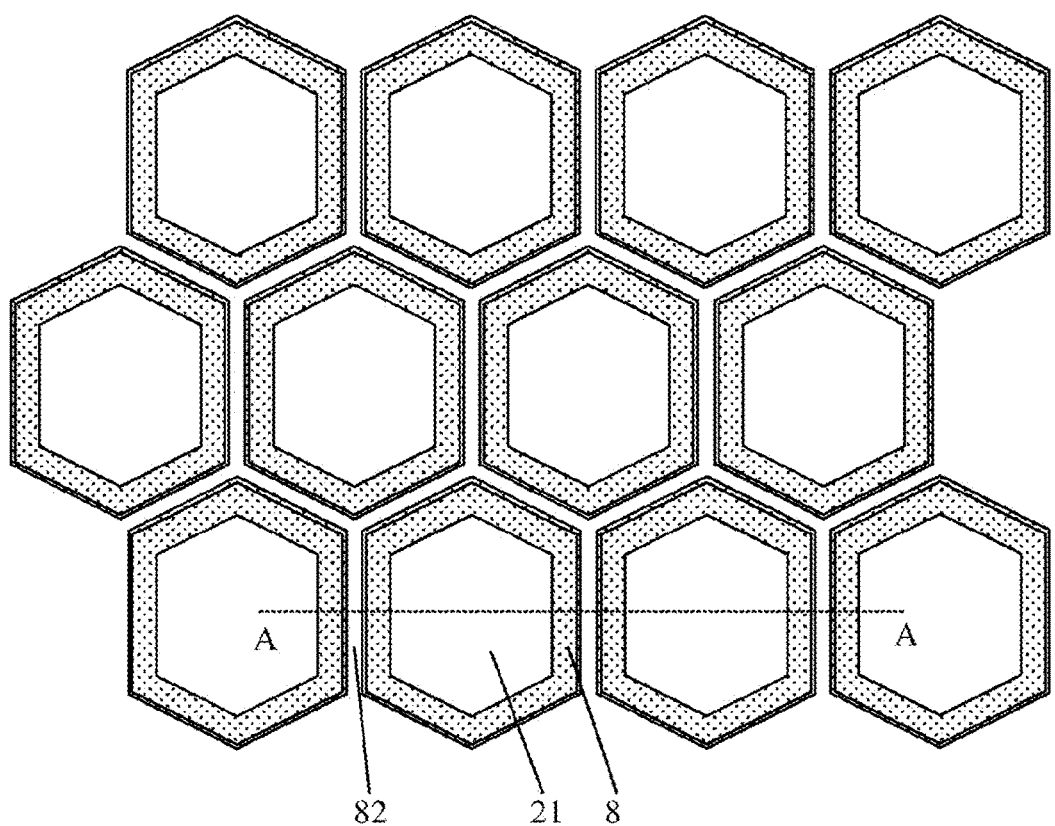
FIG. 2 is a schematic diagram of a planar structure of a display substrate in an exemplary embodiment of the present disclosure.
Figure 3:
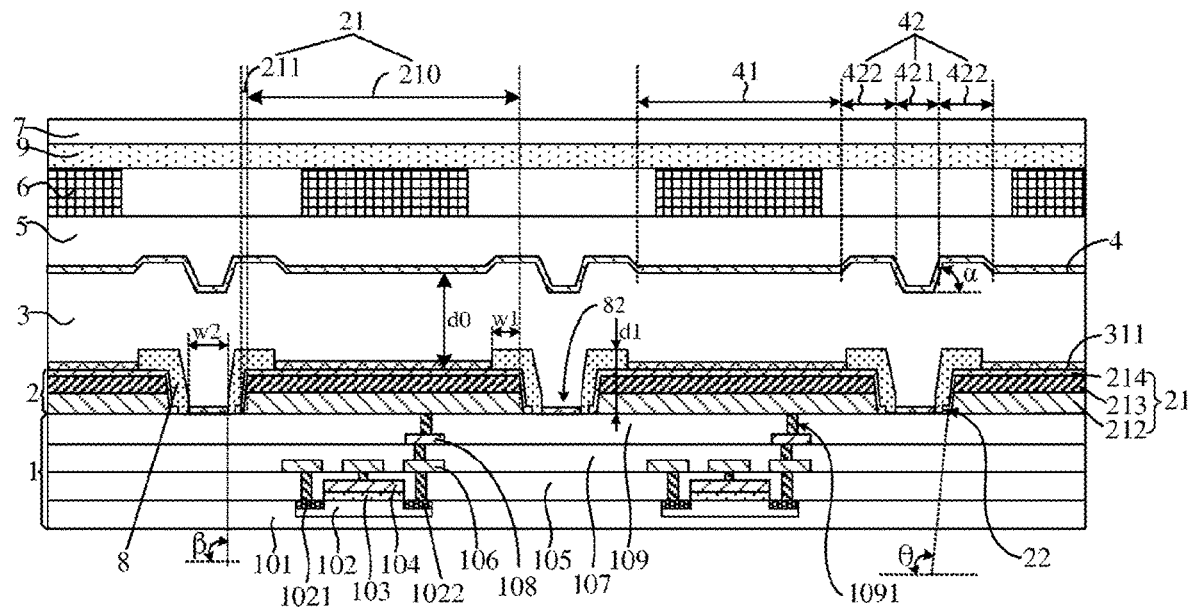
FIG. 3 is a schematic diagram of a structure of an A-A section of the display substrate shown in FIG. 2 in an exemplary embodiment.

FIG. 2 is a schematic diagram of a planar structure of a display substrate in an exemplary embodiment of the present disclosure. Only partial structures of a first electrode layer 2 and an electric leakage cutoff layer 8 are shown in FIG. 2. FIG. 3 is a schematic diagram of a structure of an A-A section of the display substrate shown in FIG. 2 in an exemplary embodiment. In an exemplary embodiment, as shown in FIG. 3, the display substrate includes a driving backplane 1, a first electrode layer 2, an electric leakage cutoff layer 8, a light-emitting functional layer 3 and a second electrode layer 4.

The driving backplane 1 includes a driving structure layer and a planarization layer 109 overlying the driving structure layer. The planarization layer 109 may be an inorganic layer, and the material of the planarization layer 109 may include at least one of silicon oxide, silicon nitride and silicon oxynitride. A via hole 1091, which is used for connecting the first electrode layer 2 with the driving backplane 1, is provided in the planarization layer 109. The via hole 1091 may be filled with a conductive metal (such as tungsten, etc.). The planarization layer 109 has a flat surface in a position outside the via hole 1091. The first electrode layer 2 is located on the surface of the planarization layer 109, and the first electrode layer 2 may be connected to the driving backplane 1 through the conductive metal filled in the via hole 1091.

The first electrode layer 2 is located at one side of the planarization layer 109 away from the driving structure layer, and includes a plurality of first electrodes 21 distributed in an array. There is a spacing groove 22, which exposes the flat surface of the planarization layer 109, between two adjacent first electrodes. The first electrode 21 includes a flat middle portion 210. The first electrode 21 is electrically connected to the driving structure layer through the conductive metal in the via hole.

The electric leakage cutoff layer 8 is located at one side of the first electrode layer 2 away from the driving backplane 1. The electric leakage cutoff layer 8 is located between two adjacent first electrodes 21. A cutoff groove 82 corresponding to the spacing groove 22 is provided in the electric leakage cutoff layer 8, and the cutoff groove 82 exposes the flat surface of the planarization layer 109. The depth of the cutoff groove 82 is greater than or equal to the thickness of the middle portion 210. The electric leakage cutoff layer 8 laps over a surface of at least one side of the middle portion 210 of the first electrode 21 away from the driving backplane. The depth of the cutoff groove 82 is a distance between an upper surface of the electric leakage cutoff layer 8 lapping over the middle portion 210 and a bottom surface of the cutoff groove 82.

The light-emitting functional layer 3 is located at one side of the electric leakage cutoff layer 8 and the first electrode layer 2 away from the driving backplane. The light-emitting functional layer 3 is in contact with a surface of the driving backplane through the cutoff groove 82.

The second electrode layer 4 is located at one side of the light-emitting functional layer 3 away from the driving backplane 1, and the second electrode layer 4 is a continuous film layer.

It may be understood by those skilled in the art that the light-emitting functional layer includes a hole injection layer located on the surface of the first electrode 21.

In the display substrate in accordance with an embodiment of the present disclosure, the electric leakage cutoff layer 8 laps over the surface of at least one side of the middle portion 210 of the first electrode 21 away from the driving backplane, the cutoff groove 82 is arranged at a position corresponding to the spacing groove 22, and the cutoff groove 82 exposes the flat surface of the planarization layer 109, so that a deep groove may be formed in the position of the cutoff groove 82. Therefore, at the time of performing whole-surface evaporation on the light-emitting functional layer 3, the hole injection layer 311 of the light-emitting functional layer 3 may be cut off by the deep groove formed by the cutoff groove 82, so that the hole injection layers 311 at both sides of the electric leakage cutoff layer 8 are disconnected from each other. Therefore, in a one pixel working state (that is, one pixel emits light), the current will not transmit from the first electrode to other adjacent pixels through the hole injection layer, thereby avoiding lateral leakage, avoiding the phenomenon of concomitant light emitting or crosstalk, improving the color gamut of the display, and improving the quality and color purity of the display.

In an exemplary embodiment, as shown in FIG. 2, the first electrode 21 is in the shape of a hexagon. In other embodiments, the first electrode may be in other shapes, for example, in the shape of any one of a quadrilateral, an octagon, a circle, etc. The shape of the first electrode may be determined according to actual needs, which is not limited herein.

In an exemplary embodiment, as shown in FIG. 2, the cutoff groove 82 is arranged around the first electrode 21. With such a structure, the cutoff groove 82 may cut off the first electrode surrounded by it from the hole injection layer of any adjacent first electrode, thereby avoiding lateral leakage between adjacent pixels.

As shown in FIG. 3, the first electrode 21 includes a flat middle portion 210 and a climbing portion 211 surrounding the middle portion 210. The second electrode layer 4 includes a plurality of gentle portions 41 and connecting portions 42 located between two adjacent gentle portions 41. The plurality of gentle portions 41 are distributed in an array and arranged in one-to-one correspondence with the middle portions 210 of the first electrodes 21. An orthographic projection of the gentle portion 41 on the driving backplane is within an orthographic projection of the middle portion 210 on the driving backplane. The gentle portion 41 is parallel or approximately parallel to the middle portion 210.

As shown in FIG. 3, the connecting portion 42 includes a concave portion 421 and convex portions 422 located at both sides of the concave portion 421. The concave portion 421 is recessed towards the driving backplane, the convex portion 422 connects the concave portion 421 and the gentle portion 41, and the convex portion 422 protrudes away from the driving backplane.

In an exemplary embodiment, as shown in FIG. 3, the electric leakage cutoff layer 8 located at both sides of the cutoff groove 82 laps over the surface of one side of the corresponding first electrode 21 away from the driving backplane 1, that is, the electric leakage cutoff layer 8 located at both sides of the cutoff groove 82 laps over the middle portion 210 of the corresponding first electrode 21. With such a structure, the electric leakage cutoff layer 8 may not only disconnect the hole injection layers of adjacent pixels, but also limit the disconnected hole injection layers within the ranges of the corresponding pixels, so as to ensure the uniformity of the light emitting areas of the pixels.

In an exemplary embodiment, as shown in FIG. 3, both sides of the electric leakage cutoff layer 8 may symmetrically lap over the surface of one side of the corresponding middle portion 210 away from the driving backplane.

In an exemplary embodiment, the second electrode layer 4 overlies the light-emitting functional layer 3, and driving signals may be applied to the first electrode 21 and the second electrode layer 4, so that a portion of the light-emitting functional layer 3 between the first electrode 21 and the second electrode layer 4 emits light.

In an exemplary embodiment, as shown in FIG. 3, the thickness of the light-emitting functional layer 3 located between the gentle portion 41 and the middle portion 210 is d0 in a direction perpendicular to the driving backplane. The minimum value of the sum of the thickness of the electric leakage cutoff layer 8 lapping over the middle portion 210 and the thickness of the middle portion 210 is d1 in the direction perpendicular to the driving backplane. A ratio of d1 to d0 ranges from 0.3 to 1. For example, the ratio of d1 to d0 may be any one of 0.3 to 1. In an exemplary embodiment, the ratio of d1 to d0 may be any one of 0.3, 0.4, 0.5, 0.6, 0.7, 0.8, 0.9 and 1. Those skilled in the art may understand that the value of d1 may be the depth of the cutoff groove 82. Setting a ratio of the depth of the cutoff groove 82 to the thickness of the light-emitting functional layer to be in the range of 0.3 to 1 may ensure that the electric leakage cutoff layer may cut off the hole injection layer, to avoid lateral leakage.

In an exemplary embodiment, a ratio of the thickness of the middle portion 210 to the thickness of the electric leakage cutoff layer lapping over the surface of the middle portion 210 is 2 to 4 in the direction perpendicular to the driving backplane. For example, the ratio of the thickness of the middle portion 210 to the thickness of the electric leakage cutoff layer lapping over the surface of the middle portion 210 may be any one of 2, 2.5, 3, 3.5 and 4. In an exemplary embodiment, the thickness of the middle portion 210 is 1000 angstroms to 1800 angstroms, and the thickness of the electric leakage cutoff layer on the surface of the middle portion 210 is 300 angstroms to 800 angstroms. For example, the thickness of the middle portion 210 may be any one of 1000 angstroms, 1100 angstroms, 1200 angstroms, 1300 angstroms, 1400 angstroms, 1500 angstroms, 1600 angstroms, 1700 angstroms and 1800 angstroms, and the thickness of the electric leakage cutoff layer on the surface of the middle portion 210 may be any one of 300 angstroms, 400 angstroms, 500 angstroms, 600 angstroms, 700 angstroms and 800 angstroms. The thickness of the middle portion and the thickness of the electric leakage cutoff layer lapping over the surface of the middle portion may be selected such that the ratio of the thickness of the middle portion 210 to the thickness of the electric leakage cutoff layer lapping over the surface of the middle portion 210 is 2 to 3.

In FIG. 3, in an area where the electric leakage cutoff layer 8 laps over the middle portion 210, the surface of one side of the electric leakage cutoff layer 8 away from the driving backplane is a flat surface, but is not limited thereto. In other embodiments, in the area where the electric leakage cutoff layer 8 laps over the middle portion 210, the surface of one side of the electric leakage cutoff layer 8 away from the driving backplane may also be a non-flat surface, e.g., any of irregular surfaces such as a wavy surface and an arc-shaped surface.

In an exemplary embodiment, as shown in FIG. 3, the width w1 of a lap-over area between the electric leakage cutoff layer 8 and the middle portion 210 may be 0.05 μm to 0.3 μm in a plane parallel to the driving backplane. For example, the width w1 may be one of 0.05 μm, 0.1 μm, 0.15 μm, 0.2 μm, 0.25 μm and 0.3 μm. The width of the lap-over area is a dimension of the lap-over area in a direction perpendicular to an extension direction of the electric leakage cutoff layer. It may be understood by those skilled in the art that when the second electrode layer is subsequently formed, the convex portion 422 of the second electrode layer corresponds to the lap-over area. Setting the width w1 of the lap-over area between the electric leakage cutoff layer 8 and the middle portion 210 to 0.05 m to 0.3 m may ensure the gentleness of the convex portion 422, to prevent the second electrode layer from breaking.

In an exemplary embodiment, as shown in FIG. 3, the width w2 of the cutoff groove 82 is 0.3 μm to 1.5 μm. The width of the cutoff groove 82 may be any one of 0.3 μm to 1.5 μm. It may be understood by those skilled in the art that when the second electrode layer is formed subsequently, the concave portion 421 of the second electrode layer corresponds to the position in which the cutoff groove 82 is located. Setting the width of the cutoff groove 82 to 0.3 μm to 1.5 μm may prevent the second electrode layer from breaking.

It may be understood by those skilled in the art that the concave portion 421 of the second electrode layer corresponds to a deep groove in the position of the cutoff groove 82. In an exemplary embodiment, as shown in FIG. 3, a slope angle θ of the climbing portion 211 of the first electrode 21 is 70° to 90°. For example, the slope angle θ of the climbing portion 211 may be any one of 70°, 75°, 80°, 85° and 90°. The slope angle θ is an angle between the climbing portion and a bottom wall of the spacing groove.

In an exemplary embodiment, as shown in FIG. 3, a slope angle β of a side wall of the cutoff groove 82 is 60° to 120°.

For example, the slope angle θ may be any one of 60°, 65°, 70°, 75°, 80°, 85°, 90°, 95°, 100°, 105°, 110°, 115° and 120°. When the slope angle β is 60° to 90°, the cutoff groove 82 is in the shape of an opening shrinking from the driving backplane towards a direction away from the driving backplane, that is, the cutoff groove 82 is in the shape of a regular trapezoid. When the slope angle β is 90° to 120°, the cutoff groove 82 is in the shape of an opening expending from the driving backplane towards the direction away from the driving backplane, that is, the cutoff groove 82 is in the shape of an inverted trapezoid. The slope angle β of the side wall of the cutoff groove is an angle between the side wall of the cutoff groove and the bottom wall of the cutoff groove.

Those skilled in the art may understand that θ and β may determine the slope angle of the side wall of the deep groove formed by the cutoff groove 82. Setting θ to 70° to 90° and β to 60° to 120° may ensure that the deep groove may cut off the hole injection layer, and may ensure the gentleness of the concave portion 421 to prevent the second electrode layer from breaking in the concave portion 421.

In an exemplary embodiment, as shown in FIG. 3, a side surface of the first electrode 21 is not exposed through the cutoff groove 82, that is, the electric leakage cutoff layer at both sides of the cutoff groove 82 overlies the side surface of the corresponding first electrode 21 facing the spacing groove. With such a structure, the electric leakage cutoff layer may overlie the surface of one side of the first electrode 21 facing the cutoff groove, thereby reducing coupling capacitance between two adjacent first electrodes and helping to decrease interference.

In an exemplary embodiment, as shown in FIG. 3, a ratio of the thickness of the middle portion 210 to the thickness of the gentle portion 41 of the second electrode layer is 7 to 13 in the direction perpendicular to the driving backplane. In an exemplary embodiment, the material of the second electrode layer may include at least one of magnesium and silver, and the thickness of the gentle portion 41 is 140 angstroms to 200 angstroms. For example, the thickness of the gentle portion 41 may be any one of 140 angstroms, 150 angstroms, 160 angstroms, 170 angstroms, 180 angstroms, 190 angstroms and 200 angstroms. In an exemplary embodiment, the material of the second electrode layer may include one of transparent materials, such as indium tin oxide and indium zinc oxide, and the thickness of the gentle portion may be greater than 1200 angstroms.

In an exemplary embodiment, the material of the electric leakage cutoff layer 8 may include at least one of silicon oxide and silicon nitride. In an exemplary embodiment, the material of the electric leakage cutoff layer may be an organic material, such as a resin material, etc.

In an exemplary embodiment, as shown in FIG. 3, the first electrode 21 may be a multilayer structure. For example, the first electrode 21 may include a composite conductive layer located on the surface of the driving backplane and a protective conductive layer 214 located at one side of the composite conductive layer away from the driving backplane. The periphery of the protective conductive layer 214 extends at a certain slope towards the driving backplane, and is in contact with the surface of the driving backplane to form the climbing portion 211.

In an exemplary embodiment, the material of the protective conductive layer 214 may include at least one of indium tin oxide (ITO) and indium zinc oxide (IZO).

In an exemplary embodiment, the composite conductive layer may include a first conductive layer 212 and a second conductive layer 213 which are sequentially stacked from the driving backplane 1 towards the light-emitting functional layer 3. The material of the first conductive layer 212 may include titanium (Ti), and the material of the second conductive layer 213 may include at least one of silver (Ag) and aluminum (Al).

In an exemplary embodiment, the composite conductive layer may include a first conductive layer 212, a second conductive layer 213 and a third conductive layer (not shown in the figure) which are sequentially stacked from the driving backplane 1 towards the light-emitting functional layer 3. The material of the first conductive layer 212 may include titanium (Ti), the material of the second conductive layer 213 may include at least one of silver (Ag) and aluminum (Al), and the material of the third conductive layer may include titanium.

The periphery of the protective conductive layer 214 extends at a certain slope towards the driving backplane and is in contact with the surface of the driving backplane, so that the protective conductive layer 214 may clad the composite conductive layer and protect the second conductive layer 213 (the second conductive layer may be used as a reflective layer) in the composite conductive layer. Therefore, the influence of the etching process on the second conductive layer may be prevented during etching.

In an exemplary embodiment, the second electrode layer may be formed by depositing a conductive material at one side of the light-emitting functional layer 3 away from the driving backplane by atomic layer deposition, so as to ensure that the second electrode layer 4 is a continuous film layer. Furthermore, the formation of the second electrode layer 4 by atomic layer deposition will not damage the light-emitting functional layer.

It may be understood by those skilled in the art that the light-emitting functional layer 3 is integrally evaporated on one side of the electric leakage cutoff layer 8 away from the driving backplane, and the second electrode layer 4 is deposited on one side of the light-emitting functional layer 3 away from the driving backplane, so the shape of the formed light-emitting functional layer matches the shapes of the upper surfaces of the electric leakage cutoff layer and the first electrode layer, and the shape of the second electrode layer 4 matches the shape of the upper surface of the light-emitting functional layer. Therefore, the shape of the concave portion 421 corresponds to the shape of the position of the cutoff groove 82, and the shape of the convex portion 422 corresponds to the shape of the lap-over area between the electric leakage cutoff layer and the middle portion.

In an exemplary embodiment, the slope angle α of the side wall of the concave portion 421 is smaller than or equal to 65°, such that the gentleness of the concave portion may be ensured, thereby preventing the second electrode layer from breaking in the concave portion.

A bottom surface of the concave portion shown in FIG. 3 is a flat surface, but the bottom surface of the concave portion is not limited thereto. The bottom surface of the concave portion may be in the shape of an arc-shaped surface or a concave-convex surface as long as the concave portion is recessed as a whole towards the driving backplane. A top surface of the convex portion shown in FIG. 3 is a flat surface, but the top surface of the convex portion is not limited thereto. The top surface of the convex portion may be an arc-shaped surface or a concave-convex surface as long as the convex portion protrudes as a whole towards the direction away from the driving backplane.

In an exemplary embodiment, the light-emitting functional layer 3 may include a hole injection layer, a hole transport layer, a light-emitting layer, an electron transport layer and an electron injection layer which are sequentially stacked from the first electrode 21 towards the second electrode layer.

Figure 4:
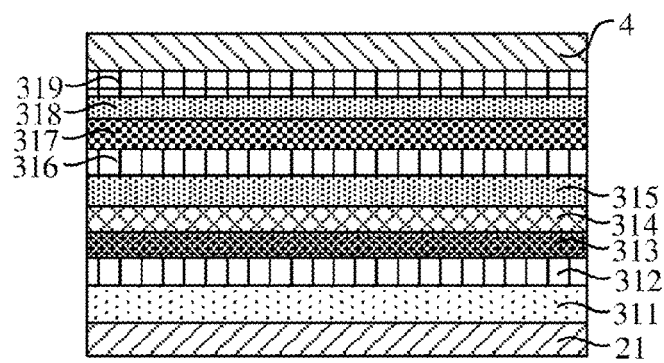
FIG. 4 is a schematic diagram of a structure of a light-emitting functional layer.

FIG. 4 is a schematic diagram of a structure of a light-emitting functional layer. In an exemplary embodiment, as shown in FIG. 4, the light-emitting functional layer 3 includes a hole injection layer 311, a hole transport layer 312, a first light-emitting layer 313, a second light-emitting layer 314, an intermediate layer (IL layer) 315, a third light-emitting layer 316, a hole blocking layer 317, an electron transport layer 318 and an electron injection layer 319 which are sequentially stacked from the first electrode 21 towards the second electrode layer 4.

In an exemplary embodiment, the thickness of the hole injection layer 311 may be 70 angstroms to 130 angstroms. For example, the thickness of the hole injection layer 311 may be any one of 70 angstroms, 80 angstroms, 90 angstroms, 100 angstroms, 110 angstroms, 120 angstroms and 130 angstroms.

In an exemplary embodiment, the thickness of the hole transport layer 312 may be 70 angstroms to 130 angstroms. For example, the thickness of the hole transport layer 312 may be any one of 70 angstroms, 80 angstroms, 90 angstroms, 100 angstroms, 110 angstroms, 120 angstroms and 130 angstroms.

In an exemplary embodiment, the thickness of the first light-emitting layer 313 may be 70 angstroms to 130 angstroms. For example, the thickness of the first light-emitting layer 313 may be any one of 70 angstroms, 80 angstroms, 90 angstroms, 100 angstroms, 110 angstroms, 120 angstroms and 130 angstroms.

In an exemplary embodiment, the thickness of the second light-emitting layer 314 may be 250 angstroms to 350 angstroms. For example, the thickness of the second light-emitting layer 314 may be any one of 250 angstroms, 280 angstroms, 300 angstroms, 320 angstroms and 350 angstroms.

In an exemplary embodiment, the thickness of the intermediate layer 315 may be 30 angstroms to 100 angstroms. For example, the thickness of the intermediate layer 315 may be any one of 30 angstroms, 40 angstroms, 50 angstroms, 60 angstroms, 70 angstroms, 80 angstroms, 90 angstroms and 100 angstroms.

In an exemplary embodiment, the thickness of the third light-emitting layer 316 may be 200 angstroms to 300 angstroms. For example, the thickness of the third light-emitting layer 316 may be any one of 200 angstroms, 230 angstroms, 250 angstroms, 280 angstroms and 300 angstroms.

In an exemplary embodiment, the thickness of the hole blocking layer 317 may be 30 angstroms to 100 angstroms. For example, the thickness of the hole blocking layer 317 may be any one of 30 angstroms, 40 angstroms, 50 angstroms, 60 angstroms, 70 angstroms, 80 angstroms, 90 angstroms and 100 angstroms.

In an exemplary embodiment, the thickness of the electron transport layer 318 may be 250 angstroms to 350 angstroms. For example, the thickness of the electron transport layer 318 may be any one of 250 angstroms, 280 angstroms, 300 angstroms, 320 angstroms and 350 angstroms.

In an exemplary embodiment, the thickness of the electron injection layer 319 may be 800 angstroms to 1000 angstroms. For example, the thickness of the electron injection layer 319 may be any one of 800 angstroms, 820 angstroms, 840 angstroms, 850 angstroms, 880 angstroms, 900 angstroms, 920 angstroms, 940 angstroms, 950 angstroms, 980 angstroms and 1000 angstroms.

In an exemplary embodiment, the first light-emitting layer 313 may be a light-emitting layer that can emit red light. The second light-emitting layer 314 may be a light-emitting layer that can emit green light. The third light-emitting layer 16 may be a light-emitting layer that can emit blue light.

In an exemplary embodiment, as shown in FIG. 3, the driving backplane 1 may include a driving structure layer and a planarization layer 109 overlying the driving structure layer. The driving structure layer may include a plurality of driving transistors, which are used for driving a light-emitting device to emit light to display images. Taking a driving transistor with a top gate structure as an example, the driving backplane 1 includes a base substrate 101, a gate insulating layer 103, a gate electrode 104, a first insulating layer 105 and a first wiring layer 106. The material of the base substrate 101 may be monocrystalline silicon, polysilicon, or the like, which is not particularly limited herein. The base substrate 101 may include an active region 102 and a source electrode 1021 and a drain electrode 1022 located at both ends of the active region 102. The gate insulating layer 103 overlies the active region 102. The gate electrode 104 is disposed on a surface of the gate insulating layer 103 away from the base substrate 101. The first insulating layer 105 overlies the gate electrode 104 and the base substrate 101, and a material of the first insulating layer 105 may include at least one of silicon oxide and silicon nitride. The first wiring layer 106 is disposed on a surface of the first insulating layer 105 away from the base substrate 101. The first wiring layer 106 includes a plurality of metal wires. The gate electrode 104, the source electrode 1021 and the drain electrode 1022 are all connected to the corresponding metal wires in the first wiring layer 106 through a via hole filled with tungsten or other metals. In an exemplary embodiment, a material of the gate electrode 104 may be heavily doped polysilicon.

In addition, the driving backplane 1 may further include a second insulating layer 107 and a second wiring layer 108. The second insulating layer 107 overlies the first wiring layer 106 and the first insulating layer 105, the second wiring layer 108 is arranged on a surface of the second insulating layer 107 away from the base substrate 101, the pattern of the second wiring layer 108 is not limited herein, and the second wiring layer 108 may be connected to the first wiring layer 106 through a via hole filled with tungsten or other metals.

In an exemplary embodiment, as shown in FIG. 3, the planarization layer 109 is located at one side of the second wiring layer 108 away from the base substrate 101. The planarization layer 109 may be an inorganic layer, and the material of the planarization layer 109 may include at least one of silicon oxide, silicon nitride and silicon oxynitride. A via hole, which is used for connecting the first electrode 21 with the second wiring layer 108, is provide in the planarization layer 109, and the via hole may be filled with a conductive metal (such as tungsten, etc.). The planarization layer 109 has a flat surface at a position outside the via hole. The first electrode layer 2 is located on a surface of the planarization layer 109 away from the base substrate 101, and the first electrode 21 may be connected to the second wiring layer 108 through the conductive metal filled in the via hole. In an exemplary embodiment, after an inorganic thin film is deposited on one side of the second wiring layer 108 away from the base substrate 101, the flat surface of the planarization layer 109 at the position outside the via hole may be formed using a polishing process.

In an exemplary embodiment, as shown in FIG. 3, the display substrate may further include a first encapsulation layer 5, a color filter layer 6, a second encapsulation layer 9 and a transparent cover plate 7. The first encapsulation layer 5 may overlie a second electrode layer 4. The first encapsulation layer 5 may include two inorganic layers and an organic layer located between the two inorganic layers. The color filter layer 6 is located at one side of the first encapsulation layer 5 away from the second electrode layer 4, and the color filter layer 6 includes light filtering areas which are in one-to-one correspondence with the first electrodes 21. The light filtering areas have a variety of colors, such as red, blue and green. The second encapsulation layer 9 may overlie the color filter layer 6, and the structure of the second encapsulation layer 9 may be the same as that of the first encapsulation layer 5. The transparent cover plate 7 may overlie the second encapsulation layer 9, and the material of the transparent cover plate 7 may be glass or other transparent materials.

In an exemplary embodiment, as shown in FIG. 3, the display substrate may further include a light extraction layer (not shown) located between the second electrode layer 4 and the first encapsulation layer 5. The light extraction layer may be provided corresponding to the gentle portion 41 of the second electrode layer 4.

The structure of the display substrate in accordance with an embodiment of the present disclosure will be described below through an exemplary manufacturing process of the display substrate. "Patterning process" is used hereinafter to represent a process of forming a pattern each time. "Patterning process" may include photoresist coating, mask exposure, development, etching, photoresist stripping, etc., for inorganic materials (e.g., metal layers, inorganic layers, etc.), and may include mask exposure, development, etc., for organic materials (e.g., photoresists, organic resins, etc.). Any one or more of sputtering, evaporation and chemical vapor deposition may be used for deposition, any one or more of spray coating and spin coating may be used for coating, and any one or more of dry etching and wet etching may be used for etching. A "thin film" refers to a layer of thin film manufactured with a certain material on a base substrate using a deposition or coating process. If the "thin film" does not need the patterning process in the entire manufacturing process, the "thin film" may also be called a "layer". If the "thin film" needs the patterning process in the entire manufacturing process, the "thin film" is called a "thin film" before the patterning process is performed and is called a "layer" after the patterning process is performed. The "layer" which has experienced the patterning process includes at least one "pattern". "A and B being disposed on the same layer" in the present disclosure means that A and B are formed simultaneously through a single patterning process. The "thickness" of the film layer is the dimension of the film layer in a direction perpendicular to the driving backplane.

In S1, a driving backplane is provided, wherein the driving backplane includes a driving structure layer and a planarization layer 109 overlying the driving structure layer; the planarization layer 109 is an inorganic layer, a via hole 1091 is provided in the planarization layer, the via hole 1091 is filled with a conductive metal, and the planarization layer 109 has a flat surface in a position outside the via hole 1091.

In S2, a first electrode layer is formed on the surface of the planarization layer 109 of the driving backplane, wherein the first electrode layer includes a plurality of first electrodes 21 distributed in an array, there is a spacing groove 22, which exposes the flat surface of the planarization layer 109, between two adjacent first electrodes 21, the first electrode 21 includes a flat middle portion, and the first electrode is electrically connected to the driving structure layer through the conductive metal in the via hole. This step may include the following steps.

In S21, an adhesive layer is coated on the surface of one side of the planarization layer 109 (the surface of the planarization layer 109) away from the driving structure layer, mask exposure and development are performed on the adhesive layer, a fully exposed area is formed in the position of the first electrode to remove the adhesive layer to expose the surface of the planarization layer 109, and an unexposed area is formed in the other position to retain the adhesive layer. In an exemplary embodiment, the adhesive layer includes an anti-reflective adhesive 201 and a photoresist 202 which are stacked. The step S21 may include the following steps.

Figure 5A:
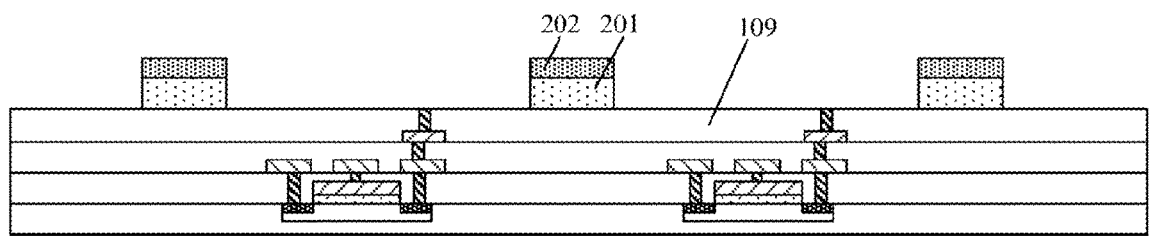
FIG. 5a is a schematic diagram of a structure of a display substrate after an adhesive layer pattern is formed.

The anti-reflective adhesive (Barc adhesive) 201 and the photoresist 202 are coated sequentially on the surface of the planarization layer 109. Mask exposure and development are performed on the photoresist 202 and the Barc adhesive 201 to form a fully exposed area in the position of the first electrode to remove the adhesive layer to expose the surface of the planarization layer 109, and an unexposed area in the other position to retain the Barc adhesive and the photoresist to form an adhesive layer pattern, as shown in FIG. 5a, which is a schematic diagram of a structure of the display substrate after the adhesive layer pattern is formed.

Figure 5B:
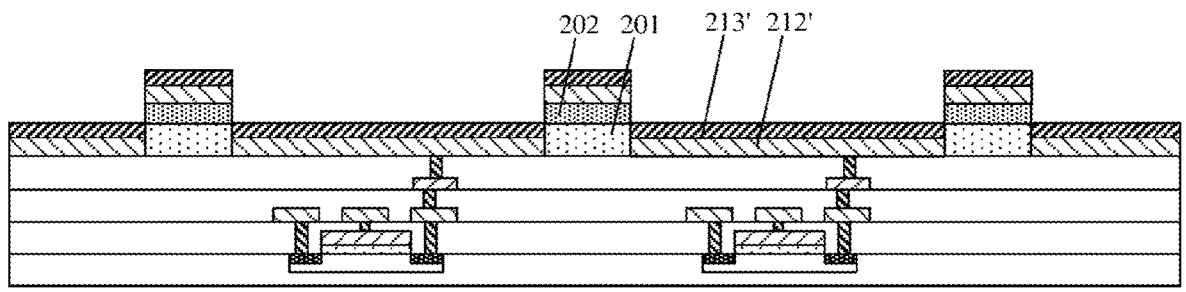
FIG. 5b is a schematic diagram of a structure of a display substrate after a composite conductive thin film is deposited.

In S22, a composite conductive thin film is deposited on the planarization layer, on which the adhesive layer pattern is formed, in the fully exposed area, the composite conductive thin film is deposited on the surface of the planarization layer, and in the unexposed area, the composite conductive thin film is deposited on a surface of the adhesive layer, as shown in FIG. 5b, which is a schematic diagram of a structure of the display substrate after the composite conductive thin film is deposited.

In an exemplary embodiment, the composite conductive thin film includes a first conductive thin film 212' and a second conductive thin film 213' which are sequentially stacked from the driving backplane 1 towards the light-emitting functional layer 3. The material of the first conductive thin film 212' includes titanium, and the material of the second conductive thin film 213' includes at least one of silver and aluminum.

In an exemplary embodiment, the composite conductive thin film may include a first conductive thin film 212', a second conductive thin film 213' and a third conductive thin film (not shown in the figure) which are sequentially stacked from the driving backplane 1 towards the light-emitting functional layer 3. The material of the first conductive thin film 212' includes titanium, the material of the second conductive thin film 213' includes at least one of silver and aluminum, and the material of the third conductive thin film may include titanium.

In an exemplary embodiment, the first conductive thin film, the second conductive thin film and the third conductive thin film may be formed by electron beam evaporation.

In S23, the adhesive layer in the unexposed area is removed to remove the composite conductive thin film on the surface of the adhesive layer, the composite conductive thin film located in the fully exposed area forming a composite conductive layer. Step S23 may include: stripping the photoresist 202 from the unexposed area, with the composite conductive thin film on the photoresist being removed together with the photoresist; and removing the remaining Barc adhesive 201 by a developing process. Therefore, the composite conductive thin film located in the fully exposed area forms the composite conductive layer, as shown in FIG. 5c, which is a schematic diagram of a structure of the display substrate after the composite conductive layer is formed.

Figure 5C:
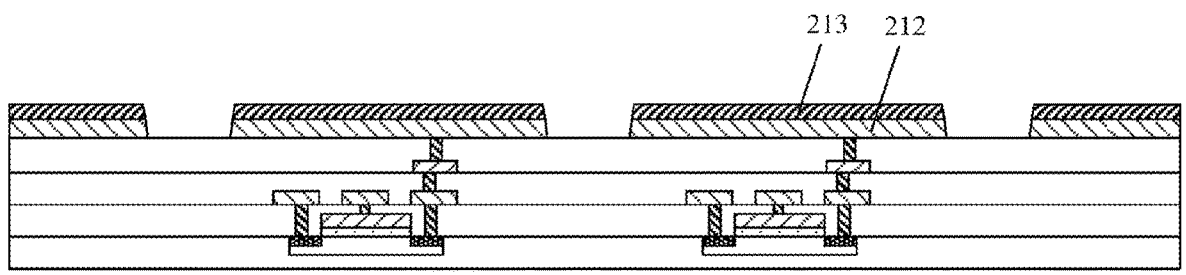
FIG. 5c is a schematic diagram of a structure of a display substrate after a composite conductive layer is formed.

In an exemplary embodiment, as shown in FIG. 5c, the composite conductive layer may include a first conductive layer 212 and a second conductive layer 213 which are sequentially stacked from the driving backplane towards the light-emitting functional layer. The material of the first conductive layer 212 includes titanium, and the material of the second conductive layer 213 includes at least one of silver and aluminum.

In an exemplary embodiment, the composite conductive layer includes a first conductive layer, a second conductive layer and a third conductive layer which are sequentially stacked from the driving backplane towards the light-emitting functional layer. The material of the first conductive layer 212 includes titanium, the material of the second conductive layer includes at least one of silver and aluminum, and the material of the third conductive layer includes titanium.

In S24, a protective conductive thin film is deposited on the surface of the planarization layer on which the composite conductive layer is formed, and the protective conductive thin film is patterned using a patterning process including dry etching to form a protective conductive layer overlying the composite conductive layer, the periphery of the protective conductive layer being in contact with the surface of the driving backplane. In an exemplary embodiment, S24 may include the following steps.

A protective conductive thin film is deposited on the surface of the planarization layer, on which the composite conductive layer is formed, and a photoresist is coated on the protective conductive thin film; mask exposure and development are performed on the photoresist to form an unexposed area in the position of the first electrode to retain the photoresist, and a fully exposed area in the other position which is free of photoresist to expose the protective conductive thin film; dry etching is performed on the exposed protective conductive thin film; and the remaining photoresist is stripped off to form a pattern of the protective conductive layer 214. The protective conductive layer 214 overlies the composite conductive layer. The periphery of the protective conductive layer 214 extends towards the driving backplane and is in contact with the surface of the planarization layer 109, as shown in FIG. 6, which is a schematic diagram of a structure of the display substrate after the protective conductive layer is formed.

The periphery of the protective conductive layer 214 extends toward the surface of the planarization layer and is in contact with the surface of the planarization layer 109, so that the protective conductive layer 214 may clad the composite conductive layer to protect the second conductive layer 213 (the second conductive layer may be used as a reflective layer) in the composite conductive layer. The influence of the etching process on the second conductive layer may be prevented during etching. The material of the protective conductive layer 314 may include at least one of indium tin oxide (ITO) and indium zinc oxide (IZO). In an exemplary embodiment, the protective conductive thin film may be deposited by electron beam evaporation.

Figure 6:
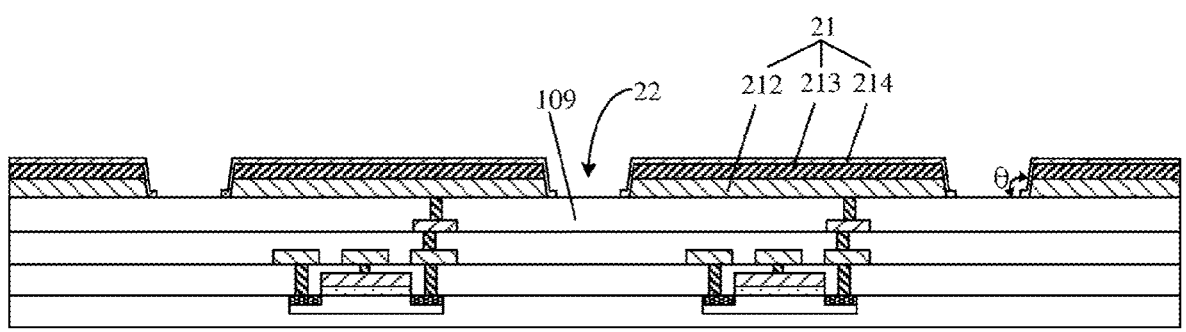
FIG. 6 is a schematic diagram of a structure of a display substrate after a protective conductive layer is formed.

As shown in FIG. 6, there is a spacing groove 22, which exposes the surface of the planarization layer 109, between two adjacent first electrodes 21. The periphery of the protective conductive layer 214 extends at a certain slope towards the planarization layer 109, and is in contact with the surface of the planarization layer 109 to form a climbing portion 211. An angle between the climbing portion 211 and a bottom wall of the spacing groove 22 is the slope angle $\theta$ of the climbing portion 211.

No etching process is used in the process of forming the composite conductive layer, and dry etching is used in the process of forming the protective conductive layer. The method of forming the first electrode layer in such a way does not employ a wet etching process, thereby satisfying the requirement of high PPI of the display panel. Furthermore, the etching process is no longer used in the process of forming the second conductive layer (a metallic silver pattern), thereby overcoming the problem that dry etching of the metal silver is difficult.

In S3, an electric leakage cutoff layer 8 is formed on the surface of the planarization layer, on which the first electrode layer is formed, wherein the electric leakage cutoff layer 8 is located between two adjacent first electrodes 21. This step may include: forming an electric leakage cutoff thin film on the planarization layer, on which the first electrode layer is formed, and patterning the electric leakage cutoff thin film through a patterning process to form the electric leakage cutoff layer 8 located between two adjacent first electrodes. A cutoff groove 82 corresponding to the spacing groove 22 is provided in the electric leakage cutoff layer 8. The cutoff groove 82 exposes the flat surface of the planarization layer. The depth of the cutoff groove is greater than or equal to the thickness of the middle portion. The electric leakage cutoff layer 8 laps over the surface of at least one side of the middle portion of the first electrode 21 away from the driving backplane, as shown in FIG. 3. In an exemplary embodiment, the material of the electric leakage cutoff layer 8 may include at least one of silicon oxide and silicon nitride. In an exemplary embodiment, the material of the electric leakage cutoff layer may be an organic material, such as a resin material, etc.

In S4, a light-emitting functional layer is formed at one side of the electric leakage cutoff layer and the first electrode layer away from the driving backplane, wherein the light-emitting functional layer includes a hole injection layer located at one side of the electric leakage cutoff layer and the first electrode layer away from the driving backplane, and the hole injection layers on both sides of the cutoff groove 82 are disconnected from each other. The light-emitting functional layer may be formed by a conventional technology in the art. For example, the organic film layer of the light-emitting functional layer may be evaporated on the driving backplane using the method of large-opening mask evaporation. When the hole injection layer is evaporated using a large-opening mask, the cutoff groove 82 may disconnect the hole injection layers located at both sides of the cutoff groove 82 from each other.

In S5, a second electrode layer is formed at one side of the light-emitting functional layer away from the driving backplane. The second electrode layer may be formed using a conventional technology in the art, and the second electrode layer is a continuous film layer, that is, the second electrode layers of a plurality of OLED light-emitting devices are a continuous integrated film layer. In an exemplary embodiment, the second electrode layer may be formed by atomic layer deposition (ALD), such that the second electrode layer may be prevented from breaking, ensuring that the second electrode layer is a continuous film layer.

It may be understood by those skilled in the art that the first encapsulation layer 5, the color filter layer 6 and the second encapsulation layer 9 may be formed sequentially on the second electrode layer using the conventional technologies in the art, which will not be repeated herein.

An embodiment of the present disclosure further provides a method for manufacturing a display substrate, as shown in FIG. 7, which is a schematic diagram of the method for manufacturing a display substrate. The method for manufacturing a display substrate may include:

providing a driving backplane including a driving structure layer and a planarization layer overlying the driving structure layer, wherein the planarization layer is an inorganic layer, a via hole is provided in the planarization layer, the via hole is filled with a conductive metal, and the planarization layer has a flat surface in a position outside the via hole;

forming a first electrode layer on the surface of one side of the planarization layer away from the driving structure layer, wherein the first electrode layer includes a plurality of first electrodes distributed in an array, there is a spacing groove, which exposes the flat surface of the planarization layer, between two adjacent first electrodes, the first electrode includes a flat middle portion, and the first electrode is electrically connected to the driving structure layer through the conductive metal in the via hole;

forming an electric leakage cutoff layer on the surface of the planarization layer, on which the first electrode layer is formed, wherein the electric leakage cutoff layer is located between two adjacent first electrodes, a cutoff groove corresponding to the spacing groove and exposing the flat surface of the planarization layer is provided in the electric leakage cutoff layer, the depth of the cutoff groove is greater than or equal to the thickness of the middle portion, and the electric leakage cutoff layer laps over a surface of at least one side of the middle portion away from the driving backplane;

forming a light-emitting functional layer at one side of the electric leakage cutoff layer and the first electrode layer away from the driving backplane; and forming a second electrode layer at one side of the light-emitting functional layer away from the driving backplane.

The detailed process of the method for manufacturing a display substrate has been described above, and will not be repeated herein.

An embodiment of the present disclosure further provides a display apparatus which includes the display substrate using the aforementioned embodiments. The display apparatus may be any product or component with a display function, such as a mobile phone, a tablet computer, a television, a display, a notebook computer, a digital photo frame, or a navigator.

Although the implementations disclosed in the present disclosure are described as above, the described contents are only implementations which are used in order to facilitate understanding of the present disclosure, and are not intended to limit the present disclosure. Any skilled person in the art to which the present disclosure pertains may make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising:
a driving backplane comprising a driving structure layer and a planarization layer overlaying the driving structure layer, wherein the planarization layer is an inorganic layer, a via hole is provided in the planarization layer, and the planarization layer has a flat surface in a position outside the via hole;

a first electrode layer located at one side of the planarization layer away from the driving structure layer, wherein the first electrode layer comprises a plurality of first electrodes distributed in an array, there is a spacing groove, which exposes the flat surface of the planarization layer, between two adjacent first electrodes, a first electrode of the plurality of first electrodes comprises a flat middle portion, and the first electrode is electrically connected to the driving structure layer through a conductive metal in the via hole;

an electric leakage cutoff layer located at one side of the first electrode layer away from the driving backplane, wherein the electric leakage cutoff layer is located between two adjacent first electrodes, a cutoff groove corresponding to the spacing groove and exposing the flat surface of the planarization layer is provided in the electric leakage cutoff layer, a depth of the cutoff groove is greater than or equal to a thickness of the middle portion, and the electric leakage cutoff layer laps over a surface of at least one side of the middle portion away from the driving backplane;

a light-emitting functional layer located at one side of the electric leakage cutoff layer and the first electrode layer away from the driving backplane; and a second electrode layer located at one side of the light-emitting functional layer away from the driving backplane; wherein the first electrode further comprises a climbing portion surrounding the middle portion;

the second electrode layer comprises a plurality of gentle portions corresponding to the middle portions and connecting portions located between two adjacent gentle portions;

a thickness of the light-emitting functional layer located between a gentle portion of the plurality of gentle portions and the middle portion is do in a direction perpendicular to the driving backplane;

a minimum value of a sum of a thickness of the electric leakage cutoff layer lapping over the middle portion and the thickness of the middle portion is d1; and a ratio of dl to do is 0.3 to 1.

2. The display substrate according to claim 1, wherein the electric leakage cutoff layer located at both sides of the cutoff groove laps over a surface of one side of a corresponding middle portion away from the driving backplane, and the electric leakage cutoff layer overlies a side surface of the first electrode facing the spacing groove.

3. The display substrate according to claim 1, wherein a ratio of the thickness of the middle portion to the thickness of the electric leakage cutoff layer lapping over the middle portion is 2 to 4 in the direction perpendicular to the driving backplane.

4. The display substrate according to claim 3, wherein the thickness of the middle portion is 1000 angstroms to 1800 angstroms, and the thickness of the electric leakage cutoff layer lapping over the surface of the middle portion is 300 angstroms to 800 angstroms.

5. The display substrate according to claim 1, wherein a ratio of the thickness of the middle portion to a thickness of the gentle portion of the second electrode layer is 7 to 13 in the direction perpendicular to the driving backplane.

6. The display substrate according to claim 1, wherein the first electrode comprises a composite conductive layer located on a surface of the driving backplane and a protective conductive layer located at one side of the composite conductive layer away from the driving backplane, a periphery of the protective conductive layer is in contact with the surface of the driving backplane, a material of the protective conductive layer comprises at least one of indium tin oxide and indium zinc oxide, the composite conductive layer comprises a first conductive layer and a second conductive layer which are sequentially stacked from the driving backplane towards the light-emitting functional layer, a material of the first conductive layer comprises titanium, and a material of the second conductive layer comprises at least one of silver and aluminum.

7. The display substrate according to claim 1, wherein the first electrode comprises a composite conductive layer located on a surface of the driving backplane and a protective conductive layer located at one side of the composite conductive layer away from the driving backplane, a periphery of the protective conductive layer is in contact with the surface of the driving backplane, and a material of the protective conductive layer comprises at least one of indium tin oxide and indium zinc oxide, the composite conductive layer comprises a first conductive layer, a second conductive layer and a third conductive layer which are sequentially stacked from the driving backplane towards the light-emitting functional layer, a material of the first conductive layer comprises titanium, a material of the second conductive layer comprises at least one of silver and aluminum, and a material of the third conductive layer comprises titanium.

8. The display substrate according to claim 1, wherein a width of a lap-over area between the electric leakage cutoff layer and the middle portion is 0.05 μm to 0.3 μm in a plane parallel to the driving backplane, the width of the lap-over area being a dimension of the lap-over area in a direction perpendicular to an extension direction of the electric leakage cutoff layer.

9. The display substrate according to claim 1, wherein a width of the cutoff groove is 0.3 μm to 1.5 μm, the width of the cutoff groove being a dimension of the cutoff groove in a direction perpendicular to an extension direction of the cutoff groove.

10. The display substrate according to claim 1, wherein the electric leakage cutoff layer located at both sides of the cutoff groove overlies a surface of one side of a corresponding first electrode facing the cutoff groove.

11. The display substrate according to claim 1, wherein a slope angle of a side wall of the cutoff groove is 60° to 120°, the slope angle of the side wall of the cutoff groove being an angle between the side wall of the cutoff groove and a bottom wall of the cutoff groove.

12. The display substrate according to claim 11, wherein a slope angle of the climbing portion is 70° to 90°, the slope angle of the climbing portion being an angle between the climbing portion and the bottom wall of the spacing groove.

13. The display substrate according to claim 1, wherein the light-emitting functional layer comprises a hole injection layer, a hole transport layer, a first light-emitting layer, a second light-emitting layer, an intermediate layer, a third light-emitting layer, a hole blocking layer, an electron transport layer and an electron injection layer stacked from the first electrode towards one side of the second electrode layer, and a thickness of the hole injection layer is 70 angstroms to 130 angstroms.

14. The display substrate according to claim 13, wherein the first light-emitting layer is a red light emitting layer, the second light-emitting layer is a green light emitting layer and the third light-emitting layer is a blue light emitting layer.

15. A display apparatus, comprising the display substrate according to claim 1.

16. A method for manufacturing a display substrate, comprising:

providing a driving backplane comprising a driving structure layer and a planarization layer overlaying the driving structure layer, wherein the planarization layer is an inorganic layer, a via hole is provided in the planarization layer, and the planarization layer has a flat surface in a position outside the via hole;

forming a first electrode layer on a surface of one side of the planarization layer away from the driving structure layer, wherein the first electrode layer comprises a plurality of first electrodes distributed in an array, there is a spacing groove, which exposes the flat surface of the planarization layer, between two adjacent first electrodes, a first electrode of the plurality of first electrodes comprises a flat middle portion, and the first electrode is electrically connected to the driving structure layer through a conductive metal in the via hole;

forming an electric leakage cutoff layer on the surface of the planarization layer, on which the first electrode layer is formed, wherein the electric leakage cutoff layer is located between two adjacent first electrodes, a cutoff groove corresponding to the spacing groove and exposing the flat surface of the planarization layer is provided in the electric leakage cutoff layer, a depth of the cutoff groove is greater than or equal to a thickness of the middle portion, and the electric leakage cutoff layer laps over a surface of at least one side of the middle portion away from the driving backplane;

forming a light-emitting functional layer at one side of the electric leakage cutoff layer and the first electrode layer away from the driving backplane; and forming a second electrode layer at one side of the light-emitting functional layer away from the driving backplane;

wherein the forming a first electrode layer on a surface of one side of the planarization layer away from the driving structure layer comprises:

coating an adhesive layer on the surface of one side of the planarization layer away from the driving structure layer, mask exposing and developing the adhesive layer, to form a fully exposed area in the position of the first electrode to remove the adhesive layer to expose the surface of the planarization layer, and an unexposed area in the other position to retain the adhesive layer;

depositing a composite conductive thin film on the driving backplane, on which an adhesive layer pattern is formed, wherein in the fully exposed area, the composite conductive thin film is deposited on the surface of the planarization layer, and in the unexposed area, the composite conductive thin film is deposited on a surface of the adhesive layer;

removing the adhesive layer from the unexposed area to remove the composite conductive thin film on the surface of the adhesive layer, the composite conductive thin film located in the fully exposed area forming a composite conductive layer; and depositing a protective conductive thin film on the surface of the planarization layer, on which the composite conductive layer is formed, and patterning the protective conductive thin film using a patterning process comprising dry etching to form a protective conductive layer overlaying the composite conductive layer, a periphery of the protective conductive layer being in contact with the surface of the planarization layer;

wherein the first electrode further comprises a climbing portion surrounding the middle portion;

the second electrode layer comprises a plurality of gentle portions corresponding to the middle portions and connecting portions located between two adjacent gentle portions;

a thickness of the light-emitting functional layer located between a gentle portion of the plurality of gentle portions and the middle portion is do in a direction perpendicular to the driving backplane;

a minimum value of a sum of a thickness of the electric leakage cutoff layer lapping over the middle portion and the thickness of the middle portion is d1; and a ratio of d1 to do is 0.3 to 1.

17. The method according to claim 16, wherein a material of the protective conductive layer comprises at least one of indium tin oxide and indium zinc oxide, the composite conductive layer comprises a first conductive layer and a second conductive layer which are sequentially stacked from the driving backplane towards the light-emitting functional layer, a material of the first conductive layer comprises titanium, and a material of the second conductive layer comprises at least one of silver and aluminum.

18. The method according to claim 16, wherein a material of the protective conductive layer comprises at least one of indium tin oxide and indium zinc oxide, the composite conductive layer comprises a first conductive layer, a second conductive layer and a third conductive layer which are sequentially stacked from the driving backplane towards the light-emitting functional layer, a material of the first conductive layer comprises titanium, a material of the second conductive layer comprises at least one of silver and aluminum, and a material of the third conductive layer comprises titanium.

* * * * *